United States Patent
Foroudi

(10) Patent No.: US 6,329,872 B1
(45) Date of Patent: Dec. 11, 2001

(54) CHARGE PUMP CIRCUIT FOR A PHASE LOCKED LOOP

(75) Inventor: Navid Foroudi, Ottawa (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/372,580

(22) Filed: Aug. 12, 1999

(Under 37 CFR 1.47)

Related U.S. Application Data

(60) Provisional application No. 60/096,692, filed on Aug. 14, 1998.

(51) Int. Cl.[7] ............................................... G05F 1/575
(52) U.S. Cl. .......................... 327/541; 327/112; 327/157; 330/17
(58) Field of Search ................................. 327/112, 157, 327/536, 541, 543, 142, 143, 198; 330/17

(56) References Cited

U.S. PATENT DOCUMENTS

| | | |
|---|---|---|
| 4,814,726 | 3/1989 | Byrd et al. ............................. 331/1 A |
| 5,220,294 | * 6/1993 | Ichikawa ................................. 331/17 |
| 5,334,951 | * 8/1994 | Hogeboom ............................. 331/17 |
| 5,420,545 | 5/1995 | Davis et al. ............................ 331/17 |
| 5,675,291 | 10/1997 | Sudjian ................................... 331/17 |
| 5,886,551 | * 3/1999 | Narahara ................................ 327/157 |
| 5,945,855 | * 8/1999 | Momtaz ................................. 327/157 |
| 6,107,889 | * 8/2000 | Strange et al. ......................... 331/17 |

FOREIGN PATENT DOCUMENTS

| | | | |
|---|---|---|---|
| 0 440 405 B1 | 8/1991 | (EP) | H03J/5/02 |
| 0 641 082 B1 | 3/1995 | (EP) | H03L/7/197 |

OTHER PUBLICATIONS

"An Improved Tail Current Source for Low Voltage Applications", F. You et al., IEEE Journal of Solid–State Circuits, vol. 32, No. 8, Aug. 1997, pp. 1173–1180.

* cited by examiner

Primary Examiner—Timothy P. Callahan
Assistant Examiner—Terry L. Englund
(74) Attorney, Agent, or Firm—Angela C. de Wilton

(57) ABSTRACT

A charge pump circuit for a phase locked loop includes series-connected FETs in which a reference current flows and other series-connected FETs in which sourcing and sinking currents flow. The junctions of the two series-connected FETs are connected to the non-inverting and inverting input terminals of an operational amplifier. The amplifier detects the voltage difference between a reference side junction and the output voltage of the charge pump circuit and provides an amplified voltage of the detected voltage difference. In response to the amplified voltage, the charge pump circuit sources to and sinks current from an external circuit to which the charge pump circuit is connected. Due to the definite and high input impedance of the operational amplifier, there is no mismatch between the source and the sink currents. A start-up FET initializes the charge pump circuit so that current flows in the series-connected FETs.

14 Claims, 5 Drawing Sheets

CHARGE PUMP CIRCUIT FOR A PHASE LOCKED LOOP

This application claim benefit to Provisional Application 60/096,692 filed Aug. 14, 1998.

TECHNICAL FIELD

This invention relates to a charge pump circuit, which is used in a phase locked loop (PLL), for instance.

BACKGROUND INFORMATION

A known PLL configuration includes a voltage controlled oscillator (VCO), a phase detector, a charge pump circuit and a loop filter. U.S. Pat. No. 5,675,291 granted to D. Sudjian on Oct. 7, 1997 discloses a PLL for use in a frequency synthesizer.

U.S. Pat. No. 5,334,951 granted to J. G. Hogeboom on Aug. 2, 1994 discloses a PLL. The prior art charge pump circuit shown in FIG. 2 of the patent is based on a current mirror circuit which includes series-connected field effect transistors (FETs) as switching devices. A VCO signal and an input signal are fed to the phase detector which detects the phase difference between both signals. The phase detector generates two pulse trains responsive to the phase difference. The pulse trains cause the switching FETs to turn-on and -off. In response to one of the pulse trains, the current mirror circuit sources current to the filter via the on-switching FET and, in response to the other pulse train, the current mirror circuit sinks current from the filter via the on-switching FET. As a result, the filter is charged or discharged and the voltage in the filter is fed to the VCO to variably control the frequency of the VCO signal. In some applications of PLLs (e.g., a frequency synthesizer) including the charge pump circuit, the VCO output frequencies are controllably varied and different frequencies require different charge pump circuit output voltages. The source and sink currents are required to be matched to each other at any voltage of the charge pump circuit output. Although the charge pump circuit is designed to have high output impedances to minimize the mismatch, it is difficult to have infinite output impedances and the mismatch is imminent. Any mismatch between the source and sink currents causes undesirable sidebands at the output of the PLL. In a case of the FETs being CMOS (complementary metal oxide semiconductor) devices, the output impedance of the current sourcing FETs becomes very low to provide low output voltage, or voltages near the positive rail.

SUMMARY OF THE INVENTION

It is an object of the present invention to provide an improved charge pump circuit.

According to one aspect of the present invention, there is provided a charge pump circuit for sourcing current to and sinking current from an external circuit, the charge pump circuit comprising: first transistor means comprising first and second transistors, each having an input control electrode and two other electrodes, the other two electrodes of both transistors being connected in series, the series-connected first and second transistors causing a first current to flow therein upon application of operating voltage to the first transistor means which develops a first voltage in response to the first current; second transistor means comprising third and fourth transistors, each having an input control electrode and two other electrodes, the other two electrodes of both transistors being connected in series, upon application of the operating voltage, the second transistor means causing a second current to flow in the third transistor and a third current to flow in the fourth transistor, a second voltage being developed across the external circuit in response to the second or third current; first feedback means for providing a first signal in response to the first and second voltages, the first signal being fed to the input control electrode of the first transistor; second feedback means for providing a second signal in response to a reference voltage and a third voltage, the second signal being fed to the input control electrode of the second transistor; first feeding means for feeding the first signal to the input control electrode of the third transistor in response to a first input signal; second feeding means for feeding the second signal to the input control electrode of the fourth transistor in response to a second input signal; and start-up means for initializing the first transistor means so that a start-up current flows therein.

The first transistor means responds to the difference between the first and second voltages and provides the first signal to the first transistor. In the series-connected first and second transistors of the first transistor means, current flows in response to the reference voltage and the first signal. Current flowing in the second transistor means is mirrored current which is proportional to the current flowing in the first transistor means. The mirrored current is sourcing current from the second transistor means to the external circuit connected to the charge pump circuit, or is sinking current from the output circuit to the second transistor means. Because the source and sink currents depend upon the voltage difference between the first and second transistor means, mismatch between the source and sink currents is reduced.

For example, the first transistor means comprises an operational amplifier. Its non-inverting and inverting input terminals are connected to the junction of the first and second transistors and the junction of the third and fourth transistors. The voltage difference between the two junctions is detected by the operational amplifier and the first signal is provided from the output terminal of the operational amplifier. Because the operational amplifier has a large input impedance, a large and definite input impedance is presented at the charge pump circuit when current sourcing and sinking. The first voltage is variably controlled in response to the first and second signals so that the first voltage matches the second voltage and hence, the mismatch of source and sink currents is reduced at any output voltage of the charge pump circuit.

The start-up means initializes first transistor means. For example, the first transistor is turned-on with initialization and a start-up current flows in the first transistor means. Once initialized, the charge pump circuit operates in current source and sink modes.

BRIEF DESCRIPTION OF THE DRAWINGS

An embodiment of the present invention will now be described by way of example with reference to the accompanying drawings in which.

DETAILED DESCRIPTION

I. Prior Art

Figure 1:
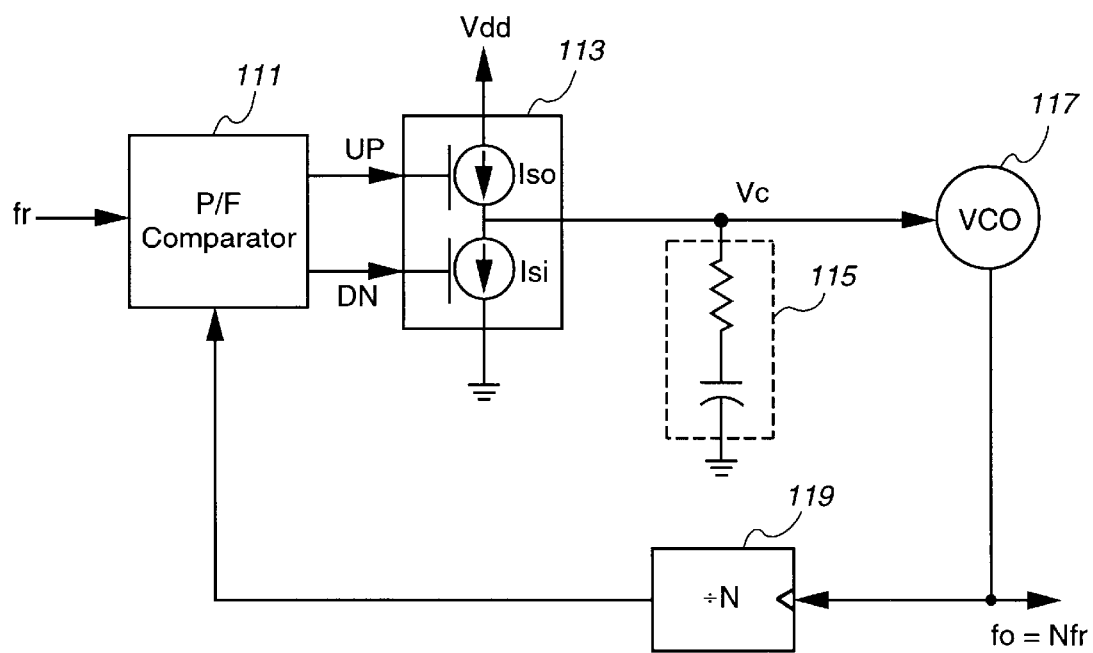
FIG. 1 is a schematic diagram of a PLL including a prior art charge pump circuit.

FIG. 1 shows a prior art PLL including a phase/frequency comparator (PFC) 111, a charge pump circuit 113, a loop filter 115, a voltage-controlled oscillator (VCO) 117 and a feedback divider (FBD) 119 having a frequency division ratio N. A reference signal of a frequency fr is fed to the PFC 111. An output signal of the VCO 117 is fed to the FBD 119 which provides a frequency divided signal to the PFC 111. In response to the differences in phase and frequency between the reference signal and the divided signal, the PFC 111 provides an input (an up signal UP or a down signal DN) to a charge pump circuit 113. The charge pump circuit 113 translates the PFC output pulses to current pulses that are fed to the filter 115. An output signal of the filter 115 drives the VCO 117. A negative feedback exists in the loop. The negative feedback adjusts the VCO frequency of, so that the two input signals to the PFC 111 have the same frequency and phase, and the PLL is "locked". The charge pump circuit 113 operates as a current source of current Iso and a current sink of current Isi, in response to the up signal UP and the down signal DN, respectively.

When the charge pump circuit 113 is locked, both source and sink current flow for a short period of time in each cycle in order to avoid a dead zone (U.S. Pat. No. 4,814,726 granted to D. A. Byrd et al. on Mar. 21, 1989).

Figure 2A:
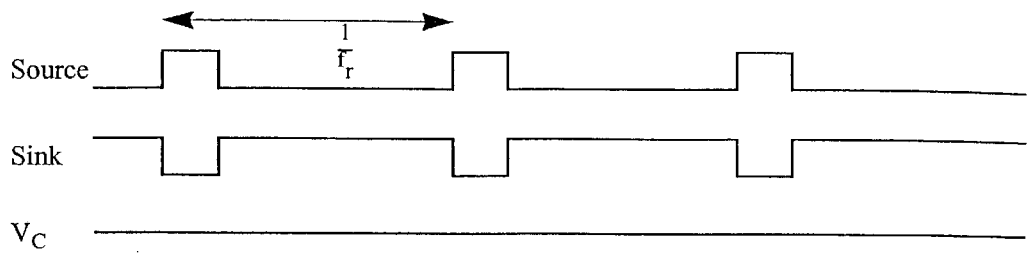
FIGS. 2A, 2B, 2C and 2D illustrate a source current, a sink current and output voltages of the charge pump circuit.

If there is no leakage at the charge pump circuit output, the source and sink currents will be perfectly matched, as shown in FIG. 2A. Such ideal source and sink current pulses result in a spur-free synthesized output from the VCO 117.

Figure 2B:
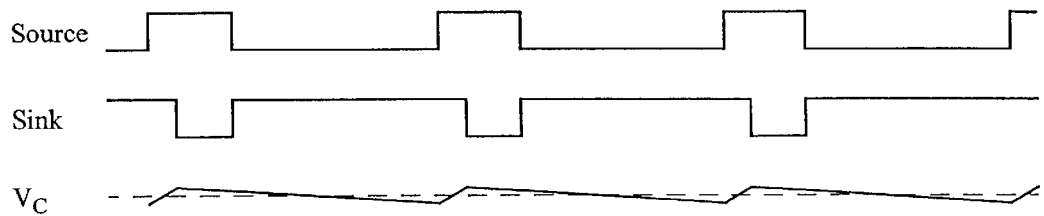
Figure 2C:
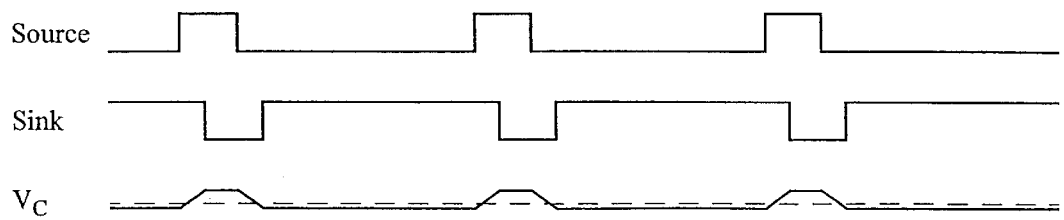

If there is a leakage at the output of the charge pump circuit 113, the PLL negative feedback adjusts the turn-on times of the sink and source currents with respect to each other, so that the average charge pump output voltage remains constant. If a leakage path to ground exists, the source and sink currents and the VCO control voltage are shown in FIG. 2B. The source and sink current pulses must terminate simultaneously. If a time difference exists between the termination time of the source and sink currents, the PLL feedback enforces a time difference in the initialization of the two currents to keep the average VCO input voltage constant. The source and sink current pulses and the VCO control voltage for such a condition are shown in FIG. 2C.

Figure 2D:
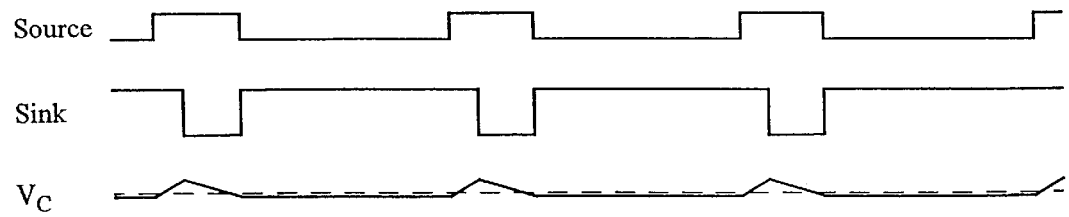

The source and sink currents should have identical amplitudes. If there is a mismatch, the PLL feedback causes a mismatch in the initiation time of the two currents to keep the average VCO control voltage constant. Typical source and sink currents and the VCO control voltage for a PLL with a sink/source mismatch are shown in FIG. 2D.

When the PLL is locked, any of the previously mentioned imperfections, or a combination of them, causes an ac component with a frequency of fr to appear at the output of the charge pump circuit 113. The ac component frequency modulates the VCO. The bandwidth of the filter 115 can be reduced to attenuate the ac component. However, this would have a negative effect on the switching speed of the PLL. Therefore, it is necessary to minimize the leakage and the timing and amplitude mismatch between the source and sink current pulses in a PLL charge pump circuit 113.

Figure 3:
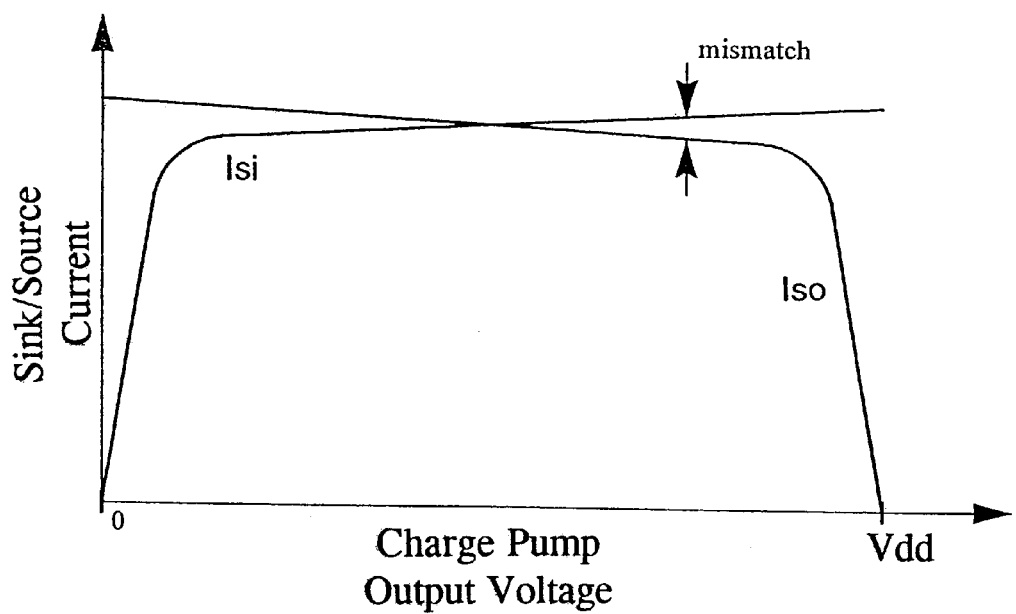
FIG. 3 illustrates charge pump output voltage vs. charge pump currents.

Any current source has a finite output impedance. The sink and source currents in a charge pump circuit are generated by current sources. The voltage across the sink current source is the charge pump output voltage. The source voltage is the supply voltage minus the charge pump voltage. When a PLL is locked, the voltage at the output of the charge pump depends on the synthesized VCO output frequency. Typical sink and source current levels, as functions of the charge pump output voltage, are shown in FIG. 3.

The mismatch between the sink and source current amplitudes depends on the charge pump voltage. The reference feedthrough is worse for the charge pump voltages that are near 0 or the positive supply voltage. Although the charge pump voltage, in general, can be any value between 0 and the supply voltage, only a portion of this range results in acceptable levels of reference feedthrough. The PLL operation must be limited to acquire a charge pump voltage away from the rails. The acceptable amount of reference feedthrough puts a limit on the range of voltage that can exist at the charge pump output. This puts a limit on the range of frequencies that can exit at the output of a given VCO. Therefore, it is required to maximize the voltage range at the charge pump output in which the mismatch is acceptable.

Cascode FET current sources used in charge pump circuits provide higher output impedances. However, cascode current sources have a high compliance voltage. That cannot be tolerated in low-voltage applications (F. You et al, "An Improved Tail Current Source for Low Voltage Applications," IEEE J. Solid-State Circuits, Vol. 32, No. 8, August 1997, pp. 1173–1180).

II. Embodiment

The following description assumes, for simplicity and purely by way of example, that the FETs referred to are MOSFETs (metal oxide semiconductor field effect transistors).

(A) Structure of an Embodiment

Figure 4:
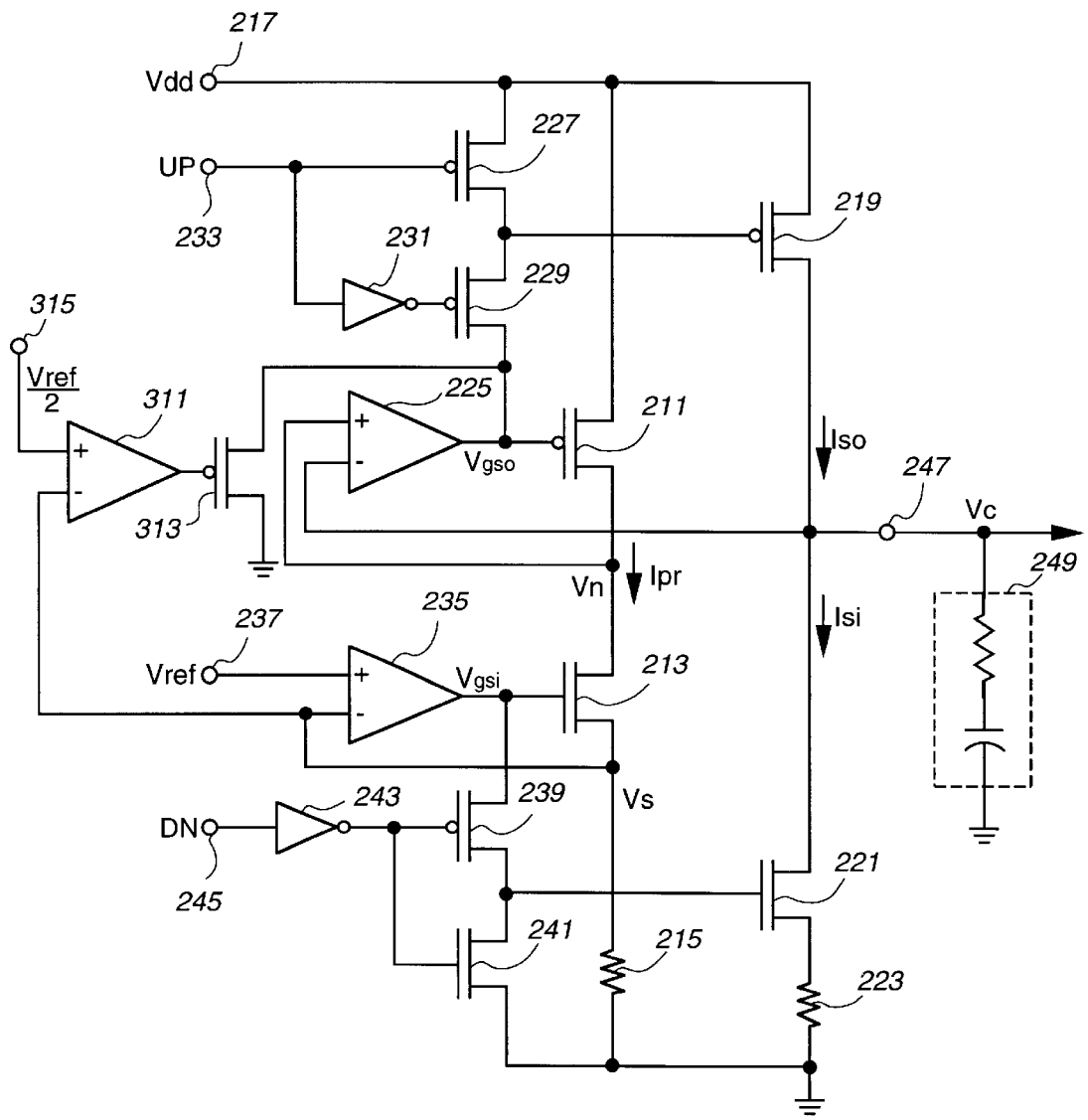
FIG. 4 is a schematic diagram of a charge pump circuit according to an embodiment of the present invention.

FIG. 4 shows a charge pump circuit according to an embodiment of the present invention. In FIG. 4, the source-drain of a P-channel FET 211, the drain-source of an N-channel FET 213 and a resistor 215 are connected in series between a terminal 217 of supply voltage Vdd (e.g., +3.3 volts) and the ground terminal. Also, the source-drain of a P-channel FET 219, the drain-source of an N-channel FET 221 and a resistor 223 are connected in series between the terminal 217 and the ground terminal. The junction of the drains of the FETs 211 and 213 and the junction of the drains of the FETs 219 and 221 are connected to the non-inverting and inverting input terminals of a MOS operational amplifier 225, the output terminal of which is connected to the gate of the FET 211. The amplifier has an infinite input impedance. Two P-channel FETs 227 and 229 are connected in series between the terminal 217 and the gate of the FET 211. The junction of the drain of the FET 227 and the source of the FET 229 is connected to the gate of the FET 219. An inverter 231 is connected between a signal input terminal 233 and the gate of the FET 229. The gate of the FET 227 is connected to the terminal 233. The source of the FET 213 is connected to the inverting input terminal of a MOS operational amplifier 235, the non-inverting input terminal of which is connected to a terminal 237 of reference voltage Vref. The reference voltage Vref is fed to the voltage terminal 237 by a dc supply (not shown). The amplifier 235 has an infinite input impedance. The output terminal of the amplifier 235 and the gate of the FET 213 are connected to the source of a P-channel FET 239, the drain of which is connected to the drain of an N-channel FET 241 and the gate of the FET 221. The source of the FET 241 is connected to the ground terminal. An inverter 243 is connected between a signal input terminal 245 and the gates of the FETs 239 and 241. Pulse trains UP and DN are fed from a phase/frequency comparator (not shown) to the signal input terminals 233 and 245, respectively. The junction of the drains of the FETs 219 and 221 is connected to an output terminal 247 which is connected to a loop filter 249 having a capacitor of an external circuit (e.g., a VCO of a PLL, not shown). The W/L (gate size) ratio of the P-channel FETs 211 and 219 is larger than that of the N-channel FETs 213 and 221.

The charge pump circuit further includes a start-up circuit of a comparator 311 and a FET 313. The non-inverting input terminal of the amplifier 311 is connected to a voltage terminal 315 of a half reference voltage Vref/2. The inverting input terminal of the comparator 311 is connected to the inverting input terminal of the amplifier 235. The output terminal of the comparator 311 is connected to the gate of the FET 313, the source and drain of which are connected to the drain of the FET 229 and the ground terminal, respectively.

(B) Operation of the Embodiment

Pulse trains UP and DN are fed from a phase/frequency comparator (not shown) to the signal input terminals 233 and 245, respectively. The reference voltage Vref is fed to the voltage terminal 237. The charge pump circuit sources current to and sinks current from the terminal 247 connected to the filter 249 and the VCO (not shown). A voltage is developed across the filter 249.

In the series-connected FETs 211 and 213, primary current Ipr flows in response to the reference voltage Vref. Due to the infinite input impedances of the MOS operational amplifiers 225 and 235, all of the current Ipr flows through the resistor 215. The current flowing in the FET 211 is equal to the current flowing in the FET 213. The current Ipr causes a voltage drop Vs across the resistor 215. The amplifier 225 amplifies the voltage difference between the voltage Vn at the junction of the drains of the FETs 211 and 213 and the output voltage Vc, so that a gate voltage Vgso is provided from its output terminal to the gate of the FET 211. Similarly, the amplifier 235 amplifies the voltage difference between the voltages Vref and Vs to provide gate voltage Vgsi to the gate of the FET 213. Accordingly, the current Ipr flowing in the series-connected FETs 211 and 213 is also dependent upon the reference voltage Vref. The current Ipr flowing in the series-connected FETs 211 and 213 is set by the negative feedback provided by the amplifier 235. Due to the high input resistances of the amplifiers 225 and 235, it is assumed that Vs=Vref and Ipr=Vref/$R_{215}$. $R_{215}$ is the resistance of the resistor 215.

Where the output voltage Vc is required to increase, the pulse train UP is fed to the terminal 233 and no pulses DN are fed. During the pulse UP being high, the FETs 229 and 227 are on and off, respectively. The current Ipr is flowing in the series-connected FETs 211 and 213. The voltage difference (Vn-Vc) is amplified by the amplifier 225 and its amplified output voltage Vgso is fed to the gate of the FET 219 via the on-FET 229. In response to the voltage Vgso, current Iso flows in the FET 219. The current Iso is mirrored current of the current Ipr. The current Iso is sourced to the filter 249 and charges the capacitor thereof. Therefore, the output voltage Vc increases during the pulse UP being high. The amplifier 225 detects the voltage difference (Vn-Vc) in the current-source mode. The negative feedback provided by the amplifier 225 guarantees that the voltage Vn is equal to the voltage Vc. The drain-source voltage of the FET 211 is equal to that of the FET 219. Hence, the current Iso flowing in the FET 219 is equal to the current Ipr flowing in the FET 211.

Where the output voltage Vc is required to decrease, the pulse train DN is fed to the terminal 245 and no pulses UP are fed. During the pulse DN being high, the FETs 239 and 241 are on and off, respectively. The voltage Vgsi, which is an amplified voltage of the voltage difference (Vref-Vs), is fed to the gate of the FET 213 and to the gate of the FET 221 via the on-FET 239. The current Isi flowing in the FET 221 in response to the voltage Vgsi is mirrored (i.e., multiplied) current of the current Ipr flowing in the FETs 211 and 213. The current Isi is sunk from the filter 249 and discharges the capacitor thereof. Therefore, the output voltage Vc decreases during the pulse DN being high. The amplifier 235 detects the voltage difference (Vn-Vs) in the current-sink mode. The negative feedback provided by the amplifier 235 guarantees that the voltage Vn is equal to the voltage Vc. The drain-source voltage of the FET 213 is equal to that of the FET 221. Hence, the current Isi flowing in the FET 221 is equal to the current flowing in the current Ipr flowing in the FET 213.

The negative feedback provided by the FETs 235 and 213 keeps the current of the FET 213 constant. Thus, the current of the FET 213 is independent from the drain-source voltage of the FET 213. The current of the FET 211 is equal to that of the FET 213 and thus, the current of the FET 211 is also independent from the drain-source voltage of the FET 211.

In a case where the W/L ratios of the FETs 219 and 221 are X times of those of the FETs 211 and 213, respectively, and the $R_{223}$ is X time of $R_{215}$, the current Iso and Isi are X times (proportional) of the current Ipr. In order to provide the sink and source currents Isi and Iso of 1 mA, with the primary current Ipr of 100 $\mu$A, examples are:

$R_{215}$:1 k$\Omega$

FET 213:W/L=10/1

FET 211:W/L=15/1

Vref:100 mV $R_{223}$:100$\Omega$

FET 221:W/L=100/1

FET 219:W/L=150/1.

When the charge pump circuit is first turned on, the voltages Vn and Vc are zero. The amplifier 225 may not turn on the FET 211 with a zero differential voltage at its inputs. When the voltages Vn and Vc are zero, the voltage Vs across the resistor 215 is also zero. The output voltage of the comparator 311 is high, so that the FET 313 is turned on. The gate of the FET 211 is pulled to the ground potential and is turned on. Also, the FET 213 is turned on by the output voltage of the amplifier 235 and current flows in the on-FETs 211 and 213. In response to the up pulses UP, the FET 219 sources current Iso to the output filter 249, with the result that the output voltage Vc increases. The start-up circuit ensures that the charge pump circuit starts properly and achieves the normal operating conditions. Under the normal conditions, the voltage Vs across the resistor 215 is Vref and thus, the output voltage of the comparator 311 is low. The start-up circuit does not affect the operation of the charge pump circuit.

Although particular embodiments of the present invention have been described in detail, it should be appreciated that numerous variations, modifications, and adaptations may be made without departing from the scope of the present invention as defined in the claims. For example, FETs other than MOSFETs may be used and the FETs of a different channel type may be used. The FETs may be replaced by bipolar transistors.

What is claimed is:

1. A charge pump circuit for sourcing current to and sinking current from an external circuit, the charge pump circuit comprising:

first transistor means comprising first and second transistors, each having an input control electrode and two other electrodes, the other two electrodes of both transistors being connected in series, the series-connected first and second transistors causing a first current to flow therein upon application of operating voltage to the first transistor means which develops a first voltage in response to the first current;

second transistor means comprising third and fourth transistors, each having an input control electrode and two other electrodes, the other two electrodes of both transistors being connected in series, upon application of the operating voltage, the second transistor means causing a second current to flow in the third transistor and a third current to flow in the fourth transistor, a second voltage being developed across the external circuit in response to the second or third current;

first feedback means for providing a first signal in response to the first and second voltages, the first signal being fed to the input control electrode of the first transistor;

second feedback means for providing a second signal in response to a reference voltage and a third voltage, the second signal being fed to the input control electrode of the second transistor;

first feeding means for feeding the first signal to the input control electrode of the third transistor in response to a first input signal;

second feeding means for feeding the second signal to the input control electrode of the fourth transistor in response to a second input signal; and start-up means for initializing the first transistor means so that a start-up current flows therein wherein the sourcing current is the second current, the sinking current is the third current, and the third voltage is from the first transistor means.

2. The charge pump circuit of claim 1, wherein the start-up means comprises turn-on means for turning-on the first transistor to initialize the first transistor means.

3. The charge pump circuit of claim 2, wherein the turn-on means comprises means for providing a turn-on signal in response to the voltage difference between a start reference voltage and the third voltage.

4. The charge pump circuit of claim 3, wherein the first feedback means comprises first response means for providing the first signal, the voltage of which is proportional to the voltage difference between the first and second voltages, the first signal causing the first current to be varied.

5. The charge pump circuit of claim 4, wherein the first response means comprises a first operational amplifier having non-inverting and inverting input terminals for receiving the first and second voltages, respectively and an output terminal for providing the first signal, the first operational amplifier varying the first signal so that the first and second voltages are matched.

6. The charge pump circuit of claim 5, wherein the second feedback means comprises second response means for providing the second signal, the voltage of which is proportional to the voltage difference between the reference voltage and the third voltage, the third voltage corresponding to the first voltage, the second signal also causing the first current to be varied.

7. The charge pump circuit of claim 6, wherein the first transistor means further comprises sense means connected in series to the first and second transistors to provide the third voltage.

8. The charge pump circuit of claim 7, wherein the second response means comprises a second operational amplifier having non-inverting and inverting input terminals for receiving the reference and third voltages, respectively and an output terminal for providing the second signal, the second operational amplifier varying the second signal so that the reference and third voltages are matched.

9. The charge pump circuit of claim 7, wherein the sense means comprises a resistance element.

10. The charge pump circuit of claim 4, wherein the first feeding means comprises a first switching means for turning on and off in response to the first input signal, so that the first signal is forwarded to the input control electrode of the third transistor and the second current is varied, when the first switching means is on.

11. The charge pump circuit of claim 10, wherein the second feeding means comprises a second switching means for turning on and off in response to the second input signal, so that the second signal is forwarded to the input control electrode of the fourth transistor and the third current is varied, when the second switching means is on.

12. The charge pump circuit of claim 4, wherein the first and third transistors are FETs of a first channel type and the second and fourth transistors are FETs of a second channel type.

13. The charge pump circuit of claim 12, wherein the first and second channel types are P- and N-channels, respectively.

14. The charge pump circuit of claim 12, wherein all of the FETs are metal oxide semiconductor transistors.

* * * * *